(12) United States Patent
Choung et al.

(10) Patent No.: US 8,557,621 B2
(45) Date of Patent: Oct. 15, 2013

(54) METHOD FOR MANUFACTURING THIN FILM TRANSISTOR ARRAY PANEL

(75) Inventors: Jong-Hyun Choung, Hwaseong-si (KR); Yang Ho Bae, Seoul (KR); Jean Ho Song, Yongin-si (KR); O Sung Seo, Seoul (KR); Sun-Young Hong, Yongin-si (KR); Hwa Yeul Oh, Asan-si (KR); Bong-Kyun Kim, Hwaseong-si (KR); Nam Seok Suh, Asan-si (KR); Dong-Ju Yang, Seoul (KR); Wang Woo Lee, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 111 days.

(21) Appl. No.: 13/157,806

(22) Filed: Jun. 10, 2011

(65) Prior Publication Data

US 2012/0135555 A1 May 31, 2012

(30) Foreign Application Priority Data

Nov. 29, 2010 (KR) .................. 10-2010-0119744

(51) Int. Cl.
*H01L 21/00* (2006.01)
(52) U.S. Cl.
USPC .............. 438/34; 257/E51.005; 257/E29.151; 257/E33.062; 257/E33.065; 257/E21.621; 257/E21.624; 345/87; 438/30; 438/149; 438/158; 438/197; 438/211; 438/238; 438/257; 438/597; 438/723; 438/724

(58) Field of Classification Search
None
See application file for complete search history.

(56) References Cited

U.S. PATENT DOCUMENTS

2011/0140111 A1* 6/2011 Jeong et al. .................. 257/59

* cited by examiner

*Primary Examiner* — Yasser Abdelaziez
(74) *Attorney, Agent, or Firm* — H. C. Park & Associates, PLC

(57) ABSTRACT

A method for manufacturing a thin film transistor array panel, including: sequentially forming a first silicon layer, a second silicon layer, a lower metal layer, and an upper metal layer on a gate insulating layer and a gate line; forming a first film pattern on the upper metal layer; forming a first lower metal pattern and a first upper metal pattern that includes a protrusion, by etching the upper metal layer and the lower metal layer; forming first and second silicon patterns by etching the first and second silicon layers; forming a second film pattern by ashing the first film pattern; forming a second upper metal pattern by etching the first upper metal pattern; forming a data line and a thin film transistor by etching the first lower metal pattern and the first and second silicon patterns; and forming a passivation layer and a pixel electrode on the resultant.

21 Claims, 11 Drawing Sheets

METHOD FOR MANUFACTURING THIN FILM TRANSISTOR ARRAY PANEL

CROSS-REFERENCE TO RELATED APPLICATION

This application claims priority to and the benefit of Korean Patent Application No. 10-2010-0119744 filed on Nov. 29, 2010, which is hereby incorporated by reference for all purposes as if fully set forth herein.

BACKGROUND OF THE INVENTION

1. Field of the Invention

Aspects of the present invention relate to a method for manufacturing a thin film transistor array panel.

2. Description of the Related Art

In general, a thin film transistor (TFT) array panel is used as a circuit board for independently driving each pixel in a liquid crystal display, an organic electroluminescence (EL) is display device, or the like. A thin film transistor array panel includes a scanning signal wire or a gate wire that transfers a scanning signal, an image signal line or a data wire that transfers an image signal, a thin film transistor that is connected to the gate wire and data wire, a pixel electrode that is connected to a thin film transistor, and the like.

The thin film transistor includes a gate electrode that is a portion of the gate wire, a semiconductor layer that includes a channel, and a source electrode and drain electrode that are portions of the data wire. The thin film transistor is a switching element that transports or interrupts an image signal that is transmitted through the data wire to a pixel electrode, according to the scanning signal that is transmitted through the gate wire.

The data line and semiconductor layer are formed using one mask, in order to reduce the number of mask processes when the thin film transistor array panel is formed. That is, a side wall of the data line is coplanar with a side wall of the semiconductor layer. However, when the data metal layer is etched, since a skew is increased, the side wall of the semiconductor layer includes a protrusion that extends past the side wall of the data metal layer.

The above information disclosed in this Background section is only for enhancement of understanding of the background of the invention and therefore it may contain information that does not constitute prior art.

SUMMARY OF THE INVENTION

The present invention has been made in an effort to minimize the protrusion of a side wall of a semiconductor layer with respect to a side wall of a data line, while a thin film transistor array panel is manufactured.

Additional features of the invention will be set forth in the description which follows, and in part will be apparent from the description, or may be learned by practice of the invention.

An exemplary embodiment of the present invention provides a method for manufacturing a thin film transistor array panel, the method including: forming a gate line that includes a gate electrode, on an insulating substrate; forming a gate insulating layer on the gate line; sequentially forming a first amorphous silicon layer, a second amorphous silicon layer, a lower data metal layer, and an upper data metal layer on the gate insulating layer; forming a first photosensitive film pattern that includes a first part and a second part that is thicker than the first part, on the upper data metal layer; forming a first lower data metal pattern and a first upper data metal pattern that includes a protrusion that protrudes from an edge thereof, by etching the upper data metal layer and the lower data metal layer, using the first photosensitive film pattern as a mask; forming a first amorphous silicon layer pattern and a second amorphous silicon layer pattern by etching the first amorphous silicon layer and the second amorphous silicon layer, using the first photosensitive film pattern as a mask; forming a second photosensitive film pattern by ashing the first photosensitive film pattern; forming a second upper data metal pattern by etching the first upper data metal pattern using the second photosensitive film pattern as a mask; forming a data line and a thin film transistor that includes a drain electrode, a semiconductor, an ohmic contact layer, and a source electrode, by etching the first lower data metal pattern, the first amorphous silicon layer pattern, and the second amorphous silicon layer pattern, using the second photosensitive film pattern as the mask; forming a passivation layer on the data line, the drain electrode, and the gate insulating layer; and forming a pixel electrode on the passivation layer, such that the pixel electrode is connected to the drain electrode. The first upper data metal pattern and the first lower data metal pattern may undercut the first is photosensitive film pattern.

According to the exemplary embodiments of the present invention, it is possible to minimize the protrusion of a side wall of a semiconductor layer, with respect to a side wall of a data line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
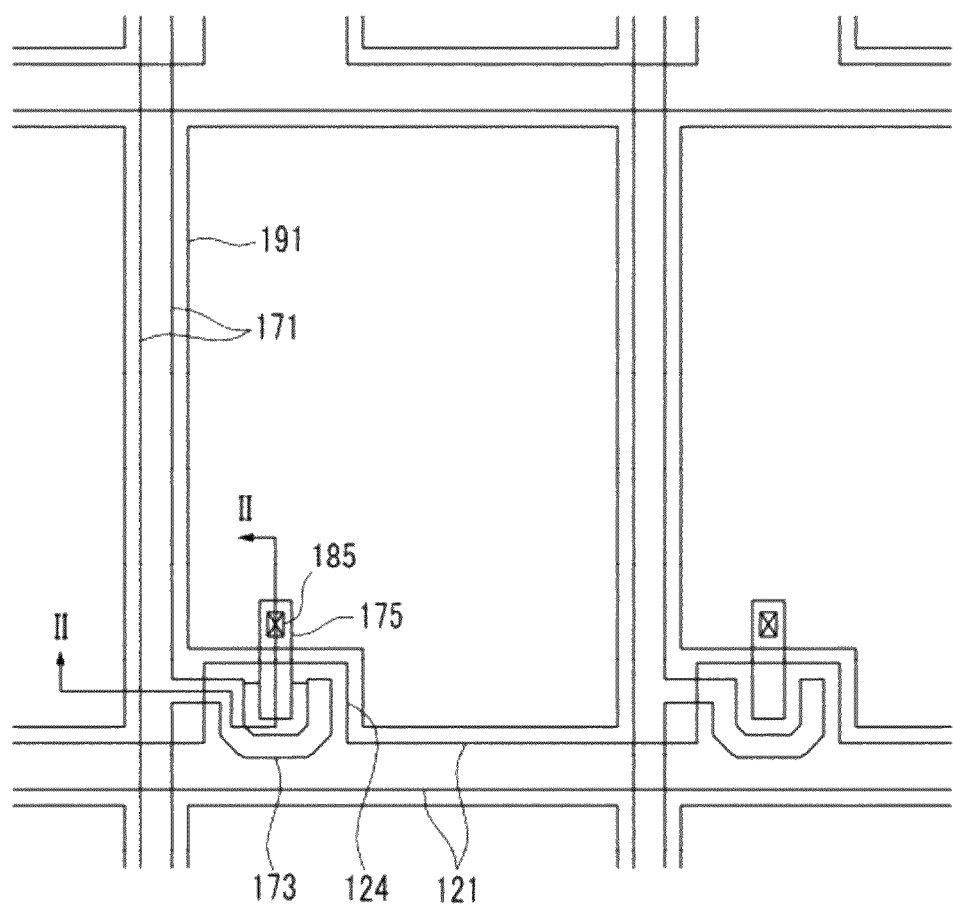
FIG. 1 is a layout view of a thin film transistor array panel, according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
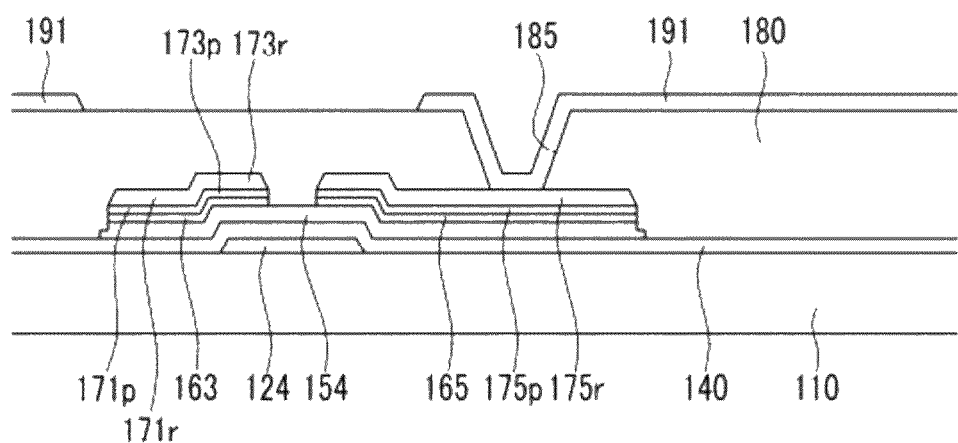
FIG. 2 is a cross-sectional view that is taken along the line II-II of FIG. 1.

FIG. 1 is a layout view that illustrates a thin film transistor array panel, according to an exemplary embodiment of the present invention, and FIG. 2 is a cross-sectional view that is taken along the line II-II of FIG. 1. Referring to FIGS. 1 and 2, a plurality of gate lines 121 that include gate electrodes 124 are formed on a substrate 110 that is made of an insulating material, such as glass or plastic, for example. A gate insulating layer 140, a plurality of semiconductor layers 154, a plurality of ohmic contacts 163 and 165, a plurality of data lines 171, and a plurality of drain electrodes 175 are sequentially formed thereon.

The gate line 121 transmits a gate signal and extends mainly in a horizontal direction. The data line 171 transmits a data signal and extends mainly in a vertical direction across the gate line 121. Each data line 171 includes a plurality of source electrodes 173 extending toward the gate electrode 124. The drain electrode 175 is separated from the data line 171 and faces the source electrode 173, across the gate electrode 124.

The data line 171, source electrode 173, and drain electrode 175 are respectively formed of lower layers 171p, 173p, and 175p and upper layers 171r, 173r, and 175r disposed respectively thereon. The lower layers 171p, 173p, and 175p are formed of titanium (Ti) or a titanium alloy, and the thickness thereof is in the range of about 100 to about 500 Å. The upper layers 171r, 173r, and 175r are formed of copper (Cu) or a copper alloy, and the thickness thereof is in the range of about 1000 to about 5000 Å.

The semiconductor layer 154 is disposed on the gate electrode 124. Ohmic contacts 163 and 165 are disposed on the semiconductor layer 154, below the data line 171 and drain electrode 175, such that the contact resistance there between is reduced.

Herein, a side wall of the semiconductor layer 154 protrudes with respect to the side walls of the data line 171 and drain electrode 175. The protrusion of the side wall of the semiconductor layer 154 is about 0.8 μm, which is less than the 1.0 to 1.2 μm protrusion range of the related art.

One gate electrode 124, one source electrode 173 and one drain electrode 175 form one thin film transistor (TFT), in conjunction with the semiconductor layer 154. A channel of the thin film transistor is formed in the semiconductor layer 154, between the source electrode 173 and drain electrode 175.

A passivation layer 180 that is made of silicon nitride and silicon oxide, for example, is formed on the data line 171 and drain electrode 175. A contact hole 185 that exposes the drain electrode 175 is formed on the passivation layer 180. A pixel electrode 191 is formed on the passivation layer 180, and is connected to the drain electrode 175 through the contact hole 185.

Figure 3:
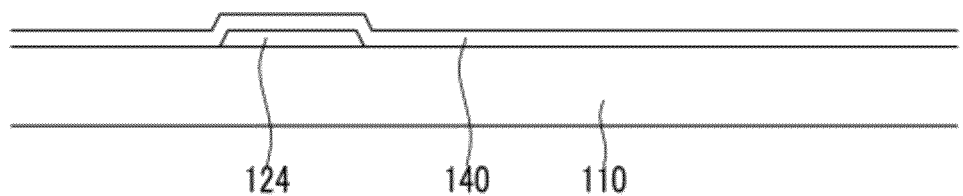
FIGS. 3, 4, 5, 6, 7, 8, 9, 10, and 11 are cross-sectional views that sequentially illustrate a manufacturing method of a thin film transistor array panel, according to an exemplary embodiment of the present invention.

FIGS. 3 to 11 are cross-sectional views that sequentially illustrate a manufacturing method of a thin film transistor array panel, according to an exemplary embodiment of the present invention. As shown in FIG. 3, after the gate line 121 that includes the gate electrode 124 is formed on the transparent insulating substrate 110, the gate insulating layer 140 is formed on the insulating substrate 110 and the gate electrode 124.

Figure 4:
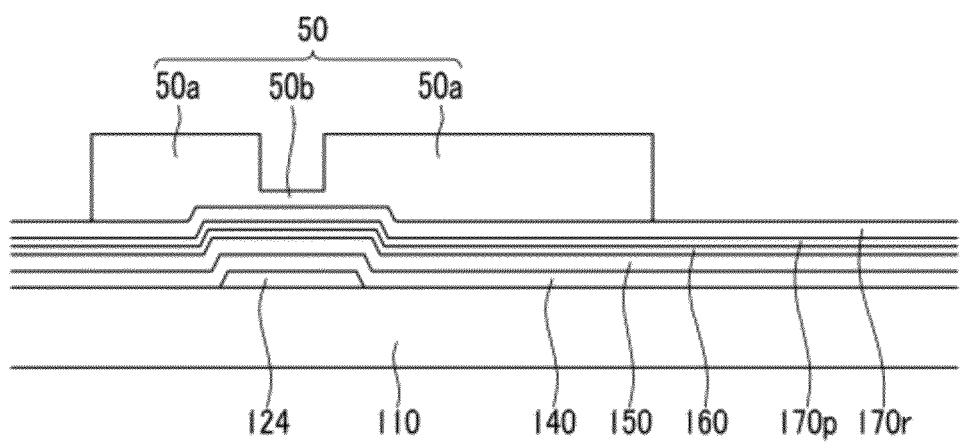

As shown in FIG. 4, an amorphous silicon layer 150, an amorphous silicon layer 160 that is doped with an impurity, and a data metal layer 170 are sequentially stacked on the gate insulating layer 140. The data metal layer 170 includes a lower metal layer 170p that is formed of titanium (Ti) or a titanium alloy, for example, and an upper metal layer 170r that is formed of copper (Cu) or a copper alloy, for example.

A first photosensitive film pattern 50 is formed on the data metal layer 170. The first photosensitive film pattern 50 includes a first part 50a and a second part 50b having different thicknesses A first photosensitive film pattern 50 is formed by coating a photosensitive film (not shown), exposing the film using a half-tone mask having transparent, trans-reflective, and opaque regions, and developing the exposed film. The trans-reflective region of the half-tone mask may be formed using a trans-reflective layer or slit pattern.

Figure 5:
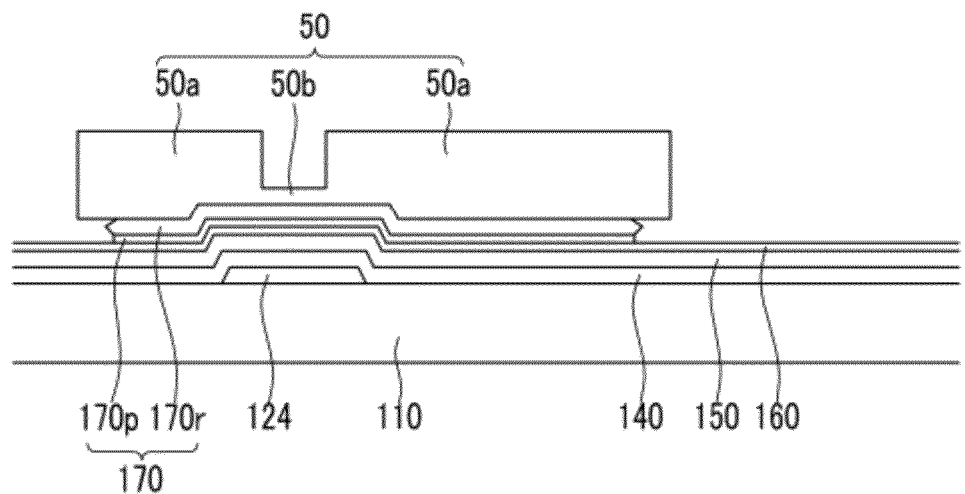

As shown in FIG. 5, a first wet etching process is performed that etches the data metal layer 170 using the first photosensitive film pattern 50 as a mask. The etched data metal layer 170 forms an undercut disposed below the first photosensitive film pattern 50. In this case, the side walls of the upper metal layer 170r protrude, and the edges of the lower metal layer 170p are disposed inside of the side walls of the upper metal layer 170r. In order to form this shape, an aqueous solution that includes, for example, 12 wt % of ammonium sulfate $(NH_4)_2S_2O_8)$, 2 wt % of inorganic acid such as nitric acid, 1 wt % of a organic acid such as an acetate, 1 wt % of hydrogen fluoride (HF), 0.7 wt % of fluoroboronate ($HBF_4$), is used in the first wet etching process.

Figure 6:
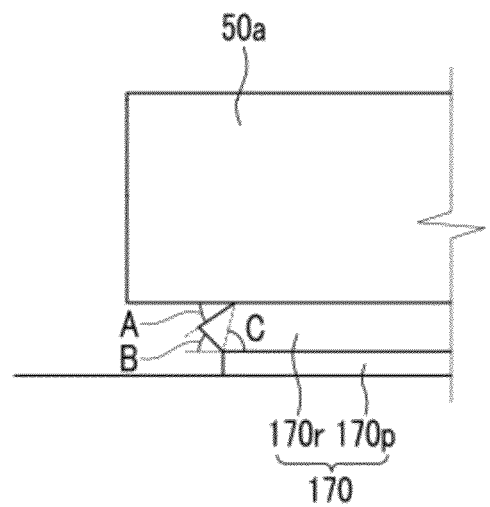

As shown in FIG. 6, the sidewalls (edges) of the upper metal layer 170r include a protrusion having an upper surface that is disposed at an angle A in the range of about 30 to about 50 degrees. The lower surface of the protrusion is disposed at an angle B in the range of about 30 to about 50 degrees. In addition, an angle C between the upper and lower surfaces of the protrusion is approximately 90 degrees.

Figure 7:
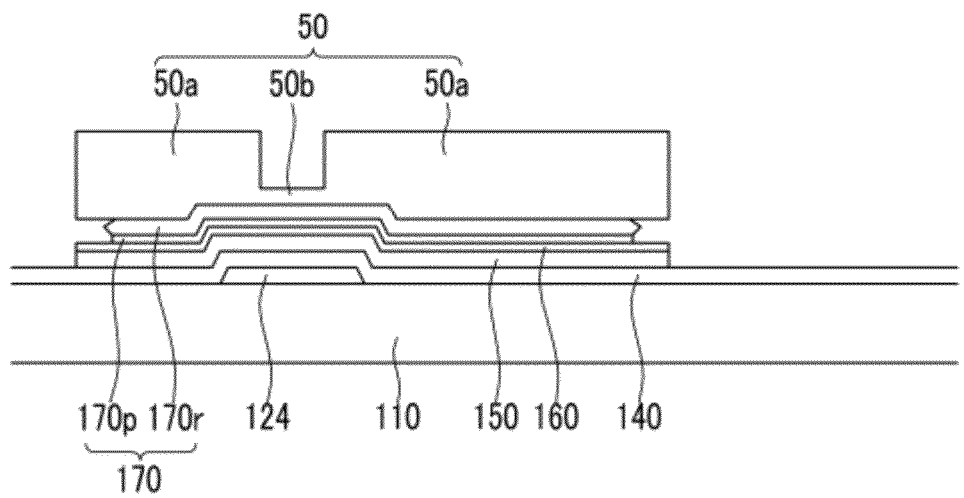

As shown in FIG. 7, a first dry etching process is performed that etches the amorphous silicon layer 150 and the amorphous silicon layer 160, using the first photosensitive film pattern 50 as a mask.

Figure 8:
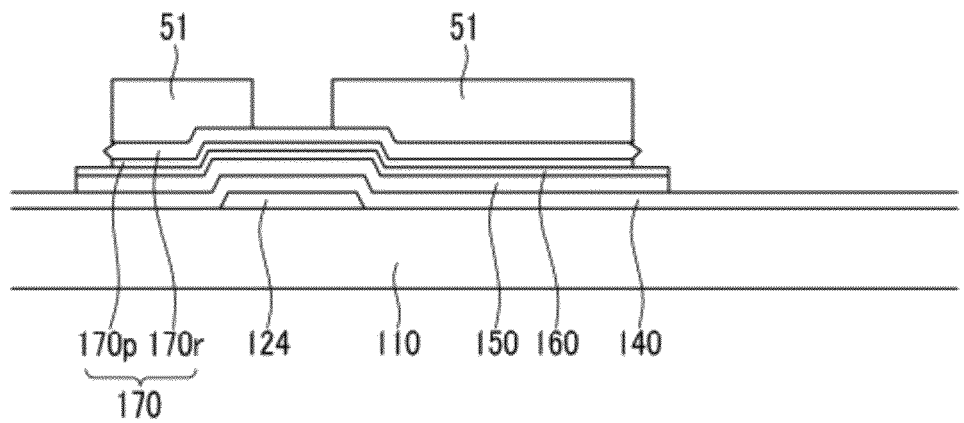

As shown in FIG. 8, a second photosensitive film pattern 51 is formed by ashing the first photosensitive film pattern 50, so that portions of the first part 50a and the second part 50b are removed. The second photosensitive film pattern 51 exposes a portion of the upper metal layer that corresponds to a channel of a thin film transistor that is subsequently formed. In this case, the side walls of the second photosensitive film pattern 51 are disposed substantially directly above the side walls of the lower metal layer 170p, such that the side walls of the second photosensitive film pattern 51 are disposed inside of the protrusion of the upper metal layer 170r. In other words, the perimeter of the lower metal layer 170p may correspond directly to the perimeter of the second photosensitive film pattern 51.

Figure 9:
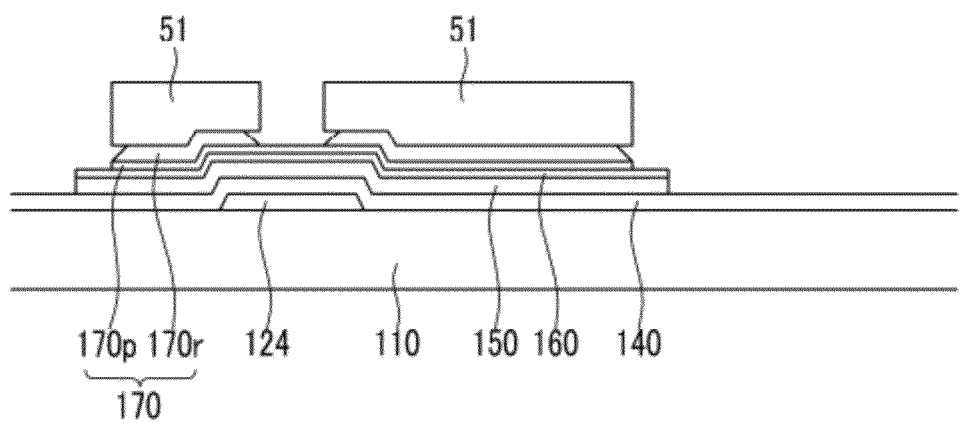

As shown in FIG. 9, a second wet etching process is performed to etch the upper metal layer 170r using the second photosensitive film pattern 51 as a mask. In this case, a portion of the upper metal layer 170r disposed above the channel of the subsequently formed thin film transistor is removed. In addition, the protrusion of the upper metal layer 170r is etched, such that the upper metal layer has sidewalls that slope inwardly from the upper surface of the lower metal layer 170p.

Figure 10:
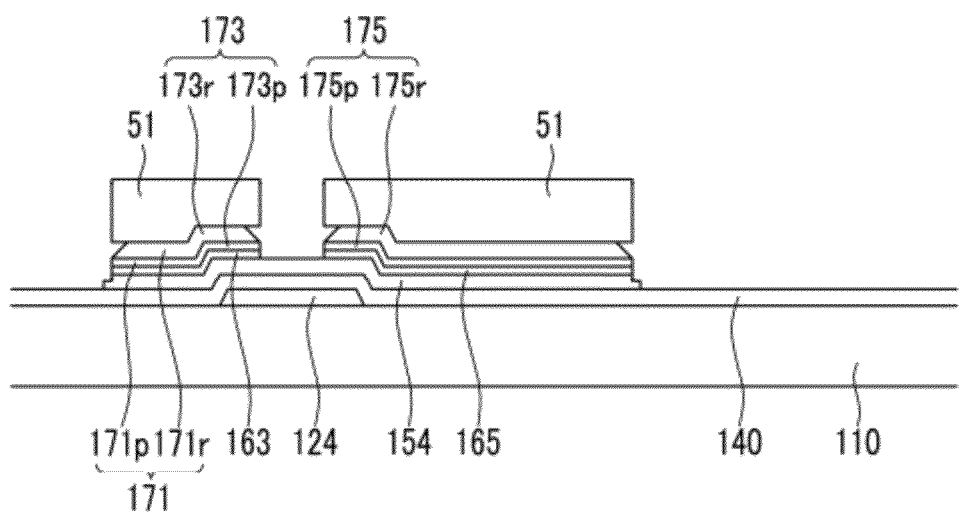

As shown in FIG. 10, a semiconductor layer 154 and a data line 171 that includes a source electrode 173, a drain electrode 175, and ohmic contact layers 163 and 165 are formed by performing a second dry etching process, using the second photosensitive film pattern 51 as a mask. The second dry etching process etches the lower metal layer 170p, the doped amorphous silicon layer 160, and the amorphous silicon layer 150 by The side walls of the semiconductor layer 154 have a stepped structure that protrudes outwardly by about 0.8 μm, which is less than the 1.0 to 1.2 μm of protrusion shown in the related art.

Figure 11:
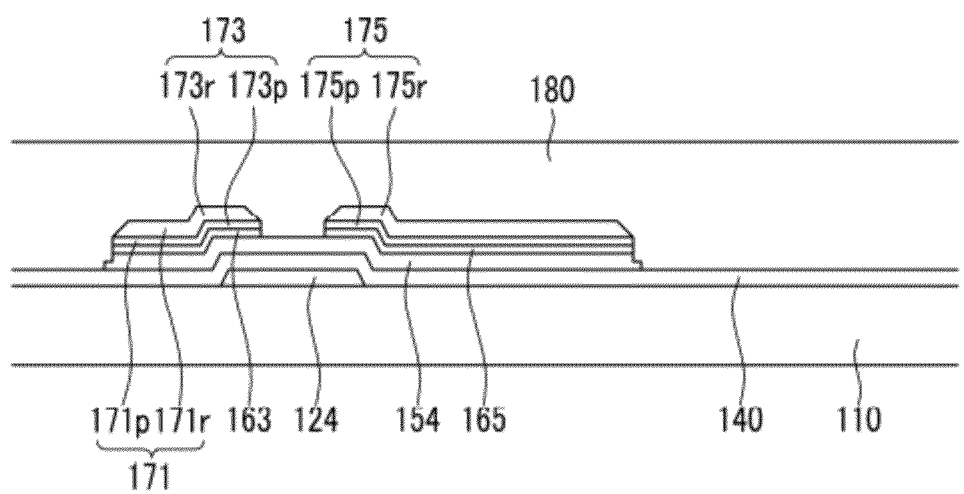

As shown in FIG. 11, after the second photosensitive film pattern 51 is removed, a passivation layer 180 is formed on the data line 171, drain electrode 175, and gate insulating layer 140. As shown in FIG. 2, after a contact hole 185 is formed, a pixel electrode 191 is formed on the passivation layer 180.

FIG. 12A is an electron micrograph of a side wall protruding part (protrusion) of a semiconductor layer, according to the related art, and FIG. 12B is an electron micrograph of a side wall protruding part (protrusion) of a semiconductor layer, according to an exemplary embodiment of the present invention.

Table 1 compares the sizes and etching times of the protrusions of the related art and the exemplary embodiment.

TABLE 1

|     | Etching time (sec.)   | Protrusion (μm)    |
| --- | --------------------- | ------------------ |
| (a) | 146.8                 | 1.01               |
| (b) | 122.3 (17% improvement) | 0.83 (18% improvement) |

Figure 12:
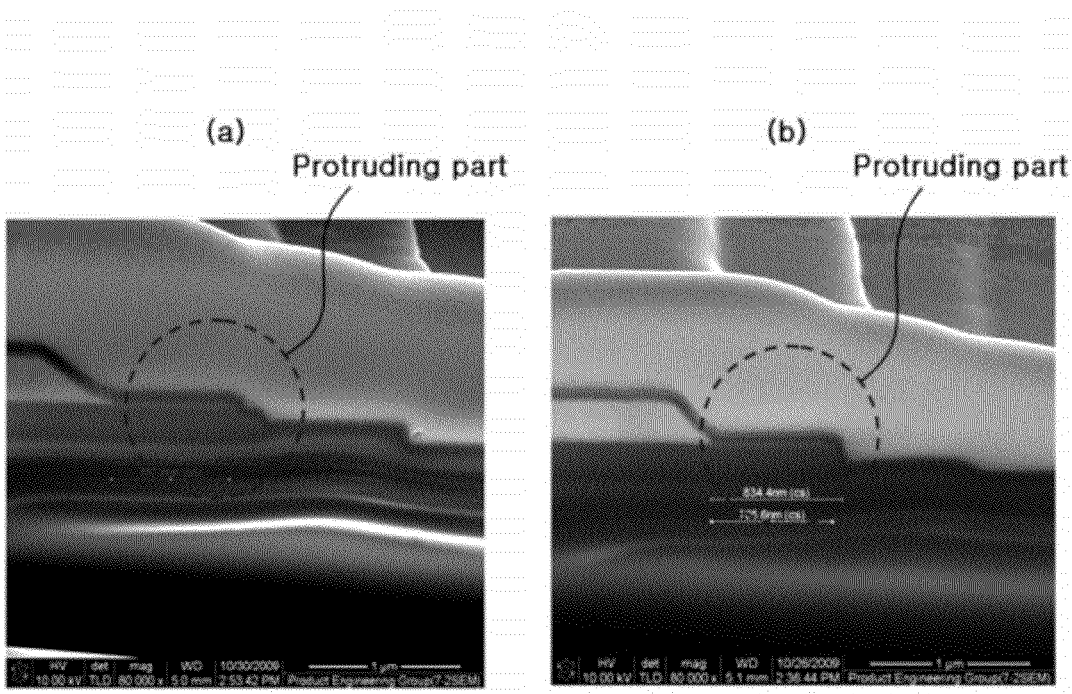
FIG. 12A is an electron micrograph of a side wall protrusion of a semiconductor layer according to the related art.
FIG. 12B is an electron micrograph of a side wall protrusion of a semiconductor layer, according to an exemplary embodiment of the present invention.

As shown in FIG. 12 and Table 1, the protrusion of the exemplary embodiment protrudes outwardly 0.83 μm, which is 18% less than the 1.01 μm of protrusion shown in the related art. In addition, the etching time of the exemplary embodiment is 17% less than that of the related art.

Figure 13:
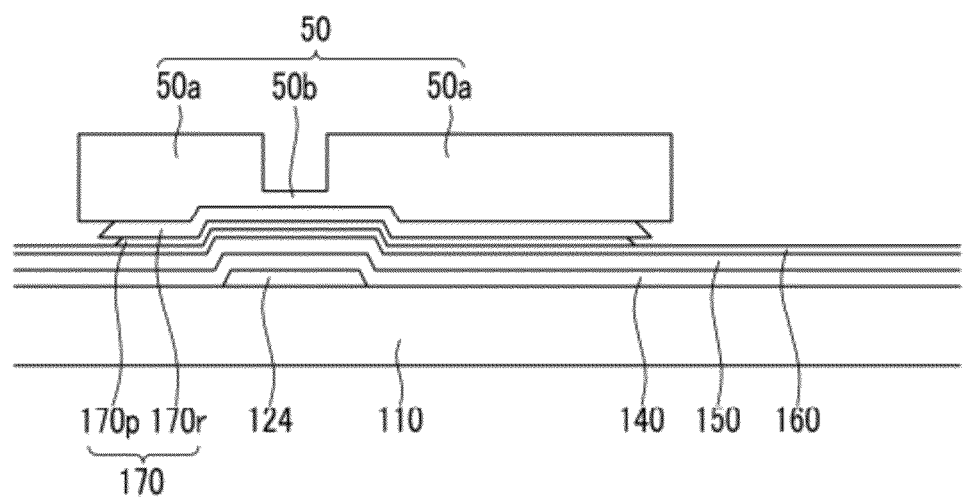
FIGS. 13, 14, 15, 16, 17, and 18 are diagrams that sequentially illustrate a manufacturing method of a thin film transistor array panel, according to another exemplary embodiment of the present invention.

FIGS. 13 to 18 are diagrams that sequentially illustrate a manufacturing method of a thin film transistor array panel, according to another exemplary embodiment of the present invention. As shown in FIG. 13, after a gate line 121 that includes a gate electrode 124 is formed on the transparent insulating substrate 110, a gate insulating layer 140 is formed on the insulating substrate 110 and the gate line 121. An amorphous silicon layer 150, an amorphous silicon layer 160 that is doped with impurity, and a data metal layer 170 are sequentially the gate insulating layer 140. Herein, the data metal layer 170 includes a lower metal layer 170p that is formed of titanium (Ti) or a titanium alloy, and an upper metal layer 170r that is formed of copper (Cu) or a copper alloy.

A first photosensitive film pattern 50 that includes a first part 50a and a second part 50b having different thicknesses is formed on the data metal layer 170. The first photosensitive film pattern 50 is formed as recited above.

A first wet etching process is performed that etches the data metal layer 170, using the first photosensitive film pattern 50 as a mask. The etching of the data metal layer 170 forms an undercut below edges of the first photosensitive film pattern 50. In particular, the is edges of the lower metal layer 170p and upper metal layer 170r are tapered, and the lower metal layer 170p is etched more than the upper metal layer 170r, such that the lower metal layer 170p undercuts the edges of the upper metal layer 170r.

The etching solution of the first wet etching process has different etching selectivities for the lower metal layer 170p and upper metal layer 170r. That is, the etching solution etches the lower metal layer 170p at a higher rate than the upper metal layer 170r.

Figure 14:
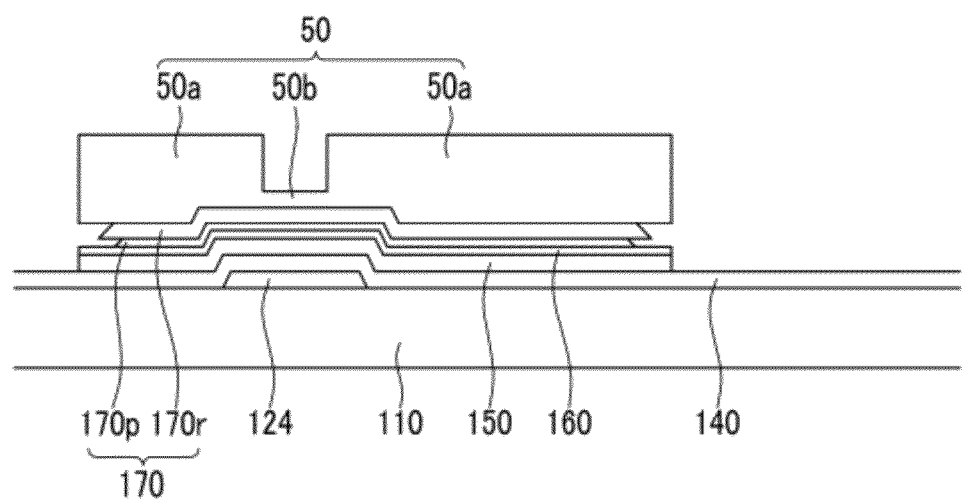

As shown in FIG. 14, a first dry etching process is performed that etches the amorphous silicon layer 150 and the doped amorphous silicon layer 160, using the first photosensitive film pattern 50 as the mask.

Figure 15:
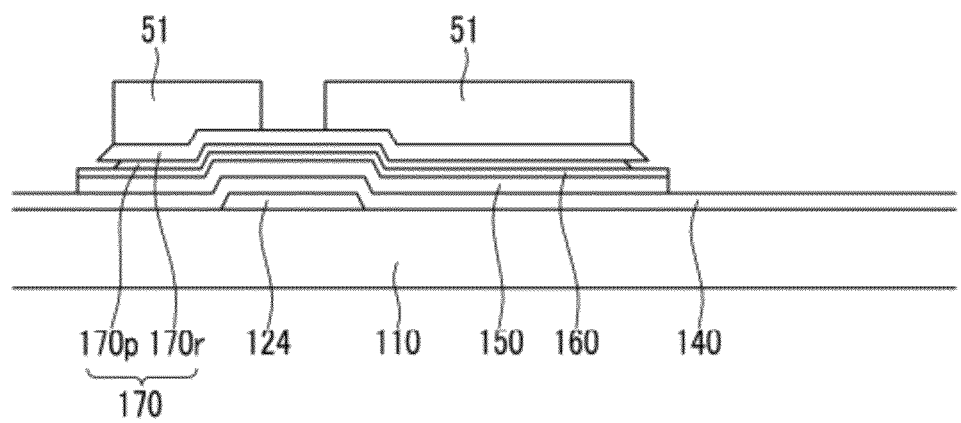

As shown in FIG. 15, a second photosensitive film pattern 51 is formed by ashing the first photosensitive film pattern 50, such that edges of the first part 50a are etched and the second part 50b is removed. The second photosensitive film pattern 51 exposes an area of semiconductor layer 150 where a channel is subsequently formed. In this case, the edges of the second photosensitive film pattern 51 correspond to the perimeter of the lower metal layer 170p. In other words, the sidewalls of the second photosensitive film pattern 51 may be disposed directly above the outer edges of the lower metal layer 170p.

Figure 16:
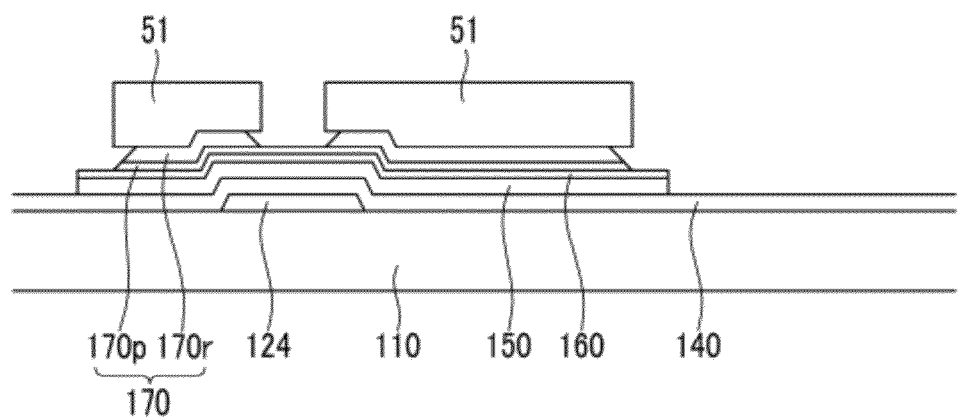
Figure 17:
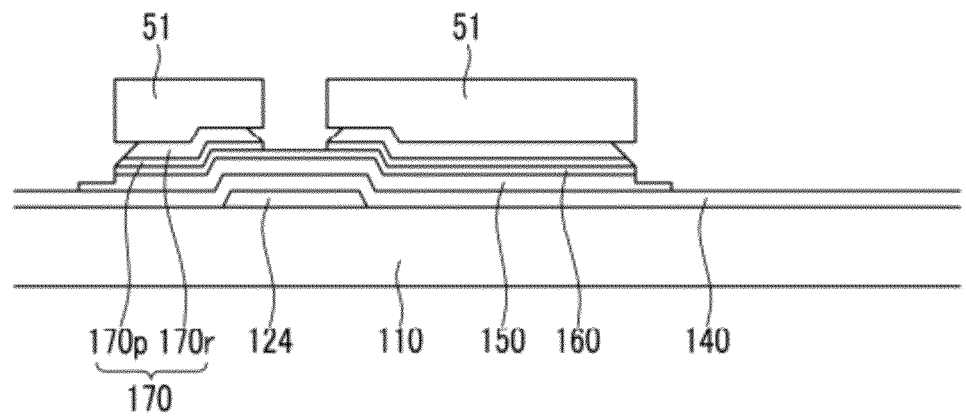
Figure 18:
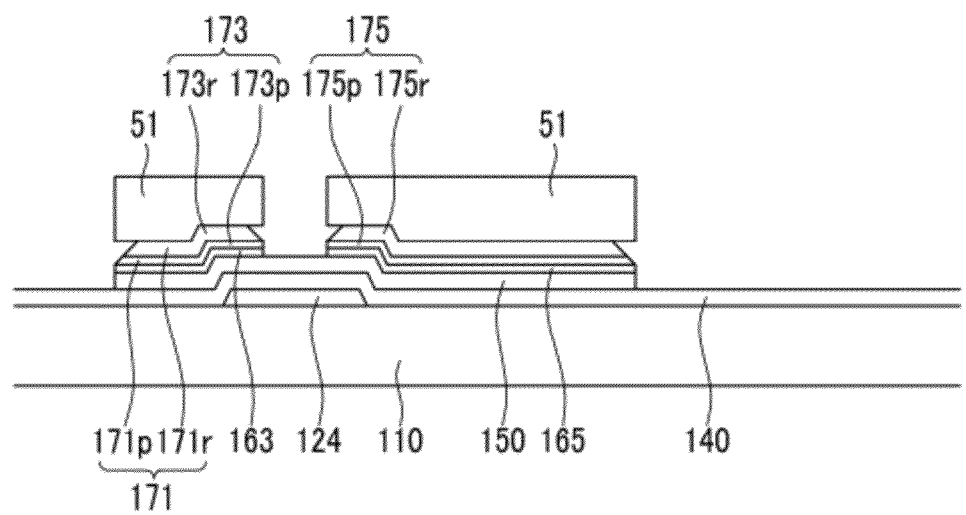

As shown in FIG. 16, a second wet etching process is performed that etches the upper metal layer 170r, using the second photosensitive film pattern 51 as a mask. As shown in FIG. 17 and FIG. 18, a second dry etching process is performed that etches the lower metal layer 170p, the doped amorphous silicon layer 160, and the amorphous silicon layer 150, using the second photosensitive film pattern 51 as a mask. In this case, edges of the doped amorphous silicon layer 160 and the amorphous silicon layer 150 are etched together. As such, a stepped protrusion is formed at the perimeter of the amorphous silicon layer 150

Thereafter, the doped amorphous silicon layer 160 is etched to expose a portion of the amorphous silicon layer 50, using the second photosensitive film pattern 51 as a mask. As such, a data line 171 including a source electrode 173, a drain electrode 175, ohmic contact layers 163 and 165, and a semiconductor layer 154 are formed.

As shown in FIG. 2, after the second photosensitive film pattern 51 is removed, a passivation layer 180 is formed on the data line 171, drain electrode 175, and gate insulating layer 140. In addition, after a contact hole 185 is formed, a pixel electrode 191 is formed on the passivation layer 180.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a thin film transistor array panel, comprising:

forming a gate line on an insulating substrate, the gate line comprising a gate electrode;

forming a gate insulating layer on the gate line;

sequentially forming a first amorphous silicon layer, a second amorphous silicon layer, a lower data metal layer, and an upper data metal layer on the gate insulating layer;

forming a first photosensitive film pattern on the upper data metal layer, the first photosensitive film pattern comprising a first part and a second part that is thicker than the first part;

performing a first etching process to form a first lower data metal pattern and a first upper data metal pattern that comprises an outwardly extending protrusion disposed at the perimeter thereof, by etching the upper data metal layer and the lower data metal layer using the first photosensitive film pattern as a mask;

performing a second etching process to form a first amorphous silicon layer pattern and a second amorphous silicon layer pattern, by etching the first amorphous silicon layer and the is second amorphous silicon layer using the first photosensitive film pattern as a mask;

ashing the first photosensitive film pattern to form a second photosensitive film pattern;

performing a third etching process to form a second upper data metal pattern, by etching the first upper data metal pattern using the second photosensitive film pattern as a mask;

performing a fourth etching process to form a data line, a source electrode that extends from the data line, a drain electrode, a semiconductor, and ohmic contact layers disposed between the source and drain electrodes and the semiconductor, by etching the first lower data metal pattern, the first amorphous silicon layer pattern, and the second amorphous silicon layer pattern using the second photosensitive film pattern as a mask;

forming a passivation layer on the data line, the drain electrode, and the gate insulating layer; and forming a pixel electrode on the passivation layer, such that the pixel electrode is connected to the drain electrode.

2. The method of claim 1, wherein the perimeters of the first upper data metal pattern and the first lower data metal pattern are disposed inside of the perimeter of the first photosensitive film pattern, so as to undercut the first photosensitive film pattern.

3. The method of claim 2, wherein the protrusion of the first upper data metal pattern extends outside of the perimeter of the second photosensitive film pattern.

4. The method of claim 3, wherein the protrusion of the first upper data metal pattern has an upper surface and an opposing lower surface.

5. The method of claim 4, wherein the lower surface of the protrusion extends from an edge of the upper surface to the perimeter of the first lower data metal pattern.

6. The method of claim 5, wherein:
the upper data metal layer comprises copper or a copper alloy; and
the lower data metal layer comprises titanium or a titanium alloy.

7. The method of claim 6, wherein:
the first etching process and the third etching process comprise wet etching processes; and
the second etching process and the fourth etching process comprise dry etching processes.

8. The method of claim 7, wherein an end of the lower surface of the protrusion of the first upper data metal pattern is disposed directly below the perimeter of the second photosensitive film pattern.

9. The method of claim 1, wherein:
the upper data metal layer comprises copper or a copper alloy; and
the lower data metal layer comprises titanium or a titanium alloy.

10. The method of claim 9, wherein:
the first etching process and the third etching process comprise wet etching processes; and
the second etching process and the fourth etching process comprise dry etching processes.

11. The method of claim 10, wherein an edge of the lower surface of the protrusion of the first upper data metal pattern is disposed directly below the perimeter of the second photosensitive film pattern.

12. The method of claim 1, wherein:
the first etching process and the third etching process comprise wet etching processes; and
the second etching process and the fourth etching process comprise dry etching processes.

13. The method of claim 12, wherein the protrusion of the first upper data metal pattern extends outside of the perimeter of the second photosensitive film pattern.

14. The method of claim 1, wherein the protrusion of the first upper data metal pattern includes an upper surface and an opposing lower surface.

15. The method of claim 14, wherein the lower surface of the protrusion of the first upper data metal pattern contacts the perimeter of the first lower data metal pattern.

16. The method of claim 1, wherein the outer edge of the first lower data metal pattern is tapered and is disposed on the inside of the protrusion of the first upper data metal pattern.

17. The method of claim 1, wherein the semiconductor comprises a protrusion that extends outwardly past side walls of the data line and the drain electrode by about 0.8 μm.

18. The method of claim 1, wherein the performance of the first etching process comprises using an etchant comprising 12 wt % of ammonium sulfate, 2 wt % of inorganic acid, 1 wt % of organic acid, 1 wt % of hydrogen fluoride, and 0.7 wt % of fluoroborionate.

19. The method of claim 18, wherein the inorganic acid comprises nitric acid and the organic acid comprises acetate.

20. The method of claim 1, wherein,
the protrusion of the first upper data metal pattern includes an upper surface and a lower surface,
the upper surface is inclined with respect to the first photosensitive film pattern in the range of about 30 to about 50 degrees, and
the lower surface is inclined with respect to the first lower data metal pattern in the range of about 30 to about 50 degrees.

21. The method of claim 20, wherein a line connecting an inner portion of the upper surface and an inner portion the lower surface is inclined with respect to the first lower data metal pattern at about 90 degrees.

* * * * *